United States Patent
Liu

(10) Patent No.: US 12,283,166 B2
(45) Date of Patent: Apr. 22, 2025

(54) EVENT-DRIVEN TRANSMISSION METHOD AND DEVICE

(71) Applicant: Stichting IMEC Nederland, Eindhoven (NL)

(72) Inventor: Yao-Hong Liu, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 624 days.

(21) Appl. No.: 17/225,812

(22) Filed: Apr. 8, 2021

(65) Prior Publication Data

US 2021/0407261 A1    Dec. 30, 2021

(30) Foreign Application Priority Data

Jun. 30, 2020   (EP) .................................. 20183029

(51) Int. Cl.
| | | |
|---|---|---|
| G08B 13/194 | (2006.01) | |
| G01R 29/02 | (2006.01) | |
| G01S 7/00 | (2006.01) | |
| G01S 7/41 | (2006.01) | |
| G01S 13/02 | (2006.01) | |
| G01S 13/04 | (2006.01) | |
| G01S 13/28 | (2006.01) | |
| G01R 29/027 | (2006.01) | |

(52) U.S. Cl.
CPC ......... *G08B 13/194* (2013.01); *G01R 29/023* (2013.01); *G01S 7/003* (2013.01); *G01S 7/415* (2013.01); *G01S 13/0209* (2013.01); *G01S 13/04* (2013.01); *G01S 13/288* (2013.01); *G01R 29/0273* (2013.01)

(58) Field of Classification Search
CPC .................................................... A61N 1/3727
USPC .......................................................... 342/134
See application file for complete search history.

(56) References Cited

U.S. PATENT DOCUMENTS 3,162,857 A * 12/1964 Sanders ................. G08C 15/12
                                                        340/870.13
3,848,231 A * 11/1974 Wootton ................ G08B 25/10
                                                        340/539.22
3,938,144 A *  2/1976 Pederson ............... G08C 15/12
                                                        370/305

(Continued)

FOREIGN PATENT DOCUMENTS

| EP | 1124211 A2 * | 8/2001 | .............. H04Q 9/00 |
| EP | 1763189 A1 | 3/2007 | |
| WO | WO91/10471 A1 * | 7/1991 | ........... A61N 1/3727 |

OTHER PUBLICATIONS

"Manchester Data Encoding for Radio Communications"; no author given; Maxim Integrated; San Jose, California, USA; Application Note 3435; dated Jan. 26, 2005; posted at analog.com. (Year: 2005).*

(Continued)

*Primary Examiner* — Bernarr E Gregory
(74) *Attorney, Agent, or Firm* — McDonnell Boehnen Hulbert & Berghoff LLP

(57) ABSTRACT

An event-driven transmission method comprises converting at least one event to at least one corresponding pulse pair and transmitting the at least one pulse pair. In this context, a delay between each pulse pair represents a corresponding identifier with respect to the respective event or with respect to at least one corresponding object causing or experiencing the respective event.

17 Claims, 11 Drawing Sheets

(56) References Cited

U.S. PATENT DOCUMENTS

| | | | | |
|---|---|---|---|---|
| 4,121,050 | A | 10/1978 | Witt | |
| 4,827,256 | A * | 5/1989 | Yokoyama | G08C 15/12 340/9.1 |
| 5,127,404 | A * | 7/1992 | Wyborny | A61N 1/3727 128/903 |
| 5,292,343 | A * | 3/1994 | Blanchette | A61N 1/3708 128/903 |
| 5,324,315 | A * | 6/1994 | Grevious | A61N 1/3727 128/903 |
| 5,354,319 | A * | 10/1994 | Wyborny | A61N 1/3727 128/903 |
| 5,752,977 | A * | 5/1998 | Grevious | A61N 1/3727 607/32 |
| 5,766,232 | A * | 6/1998 | Grevious | A61N 1/37223 607/30 |
| 6,167,310 | A * | 12/2000 | Grevious | A61N 1/37252 607/32 |
| 6,201,993 | B1 * | 3/2001 | Kruse | A61N 1/3727 607/30 |
| 6,947,795 | B2 * | 9/2005 | Bornhoft | G08C 19/24 607/32 |
| 6,961,374 | B2 * | 11/2005 | Chen | H04L 25/4902 375/238 |
| 7,525,479 | B2 * | 4/2009 | Nagai | G01S 13/48 342/158 |
| 9,140,547 | B2 | 9/2015 | Woollett et al. | |
| 2009/0043361 | A1 * | 2/2009 | Baumgartner | A61N 1/37211 607/60 |
| 2011/0199251 | A1 * | 8/2011 | Iwata | H01Q 23/00 342/27 |
| 2013/0230076 | A1 | 9/2013 | Maggio et al. | |
| 2013/0285758 | A1 * | 10/2013 | Aldridge | A61B 18/04 332/108 |

OTHER PUBLICATIONS

Extended European Search Report and Written Opinion, European Application No. 20183029.6, mailed Nov. 9, 2020, 12 pages.

Bovy, A. Collard, H. Chalopin, G. Bas, and P. Courmontagne. "IR-UWB: An high speed digital receiver for very short range transmissions." In 2008 IEEE Radio and Wireless Symposium, pp. 363-366. IEEE, 2008.

Manjunath, Sandeep. "Near-field baseband communication system for use in biomedical implants." PhD diss., University of Glasgow, 214 pages, 2009.

Zasowski, Thomas, Frank Althaus, and Armin Wittneben. "An energy efficient transmitted-reference scheme for ultra wideband communications." In 2004 International Workshop on Ultra Wideband Systems Joint with Conference on Ultra Wideband Systems and Technologies. Joint UWBST & IWUWBS 2004 (IEEE Cat. No. 04EX812), pp. 146-150. IEEE, 2004.

Dath, Gawtham G., and Anu Chalil. "FPGA Implementation of Physical Layer Data Encoding Schemes." In 2018 Second International Conference on Inventive Communication and Computational Technologies (ICICCT), pp. 1137-1140. IEEE, 2018.

Folowosele, MV Fopefolu, Jonathan Tapson, and R. Etienne-Cummings. "Wireless systems could improve neural prostheses." SPIE Newsroom 10 (2007): 2-12007090854.

Ros, Paolo Motto, Marco Paleari, Nicoló Celadon, Alessandro Sanginario, Alberto Bonanno, Marco Crepaldi, Paolo Ariano, and Danilo Demarchi. "A wireless address-event representation system for ATC-based multi-channel force wireless transmission." In 5th IEEE International Workshop on Advances in Sensors and Interfaces IWASI, pp. 51-56. IEEE, 2013.

Folowosele, Fopefolu, Jonathan Tapson, and Ralph Etienne-Cummings. "Wireless address event representation system for biological sensor networks." In Bioengineered and Bioinspired Systems III, vol. 6592, p. 659205. International Society for Optics and Photonics, 2007.

* cited by examiner

US 12,283,166 B2

EVENT-DRIVEN TRANSMISSION METHOD AND DEVICE

CROSS-REFERENCE TO RELATED APPLICATIONS

The present application is a non-provisional patent application claiming priority to European Patent Application No. 20183029.6, filed Jun. 30, 2020, the contents of which are hereby incorporated by reference.

FIELD OF THE DISCLOSURE

This application relates to an event-driven transmission method and an event-driven transmission device.

BACKGROUND

Event-based applications such as sensing applications utilize various methodologies to communicate information. For instance, U.S. Pat. No. 9,140,547 B2 relates to a transmission system for a measurement device on a coordinate positioning apparatus comprising a first station mounted on the measuring device and a second station mounted on the coordinate positioning apparatus. These stations communicate with one another using a spread spectrum radio link via, for example, frequency hopping. The first station sends a regular signal, and on receiving the signal, the second station synchronizes its clock and sends an acknowledgment signal. Measurement data is either sent in the regular signal or in a measurement event-driven signal.

Radio signals communicated between these stations consist of message packets of serial binary data. Each message contains a header that includes probe station identity data or an address that is needed to allow the machine station receiver to recognize whether the message is intended for that receiver, and to synchronize a clock in the receiving station to the probe station clock. Due to the usage of the header containing identification data, significant overhead is introduced, which leads to an inefficient transmission or communication, respectively.

SUMMARY

Accordingly, aspects of the application disclose an event-driven transmission method and an event-driven transmission device that facilitate the efficient transmission/communication of information.

According to a first aspect, an event-driven transmission method is provided. The method comprises the steps of converting at least one event to at least one corresponding pulse pair, and transmitting the at least one pulse pair. In this context, a delay between each pulse pair represents a corresponding identifier with respect to the respective event or with respect to at least one corresponding object causing or experiencing the respective event. This facilitates significantly reducing an overhead and a collision risk, which leads to a particularly efficient transmission or communication, respectively. Further, the at least one event may comprise information of polarity, and in an example, positive and/or negative polarity. It is noted that the at least one event may especially comprise or be a bipolar event. Further, it is noted that a pulse pair may comprise or be two pulses with the same polarity or two pulses with different polarities.

According to a first preferred implementation form of the first aspect, the at least one pulse pair comprises or is at least one differential pulse. In an example, this facilitates reducing complexity, thereby increasing efficiency. Further, a differential pulse may comprise or be two pulses with different polarities.

According to a second implementation form of the first aspect, for transmitting the at least one pulse pair, the at least one pulse pair is encoded according to a Manchester code, and in an example, a bipolar Manchester code. In an example, this facilitates suppressing low-frequency content of the respective signal, which further increases immunity to the respective communication channel.

According to a further implementation form of the first aspect, for transmitting the at least one pulse pair, the at least one pulse pair is encoded according to a phase modulation, and in an example, a differential phase modulation. In an example, this facilitates demodulating, by the respective receiver, the corresponding signal, and in an example, without recovering the respective carrier frequency and phase.

According to a further implementation form of the first aspect, the phase modulation comprises rotating between at least two predefined phases, and in an example, between at least three predefined phases with at least one predefined phase difference with regard to each other, and in another example, between three predefined phases with a phase difference of 120 degrees with regard to each other, and in another example, between phases of 0 degrees, 120 degrees, and 240 degrees. In an example, this facilitates ensuring a higher immunity toward a carrier offset on the respective receiver side.

According to a further implementation form of the first aspect, transmitting the at least one pulse pair is based on an impulse-radio ultra-wideband communication, and in an example, an asynchronous impulse-radio ultra-wideband communication. In an example, this facilitates further reducing complexity, which leads to increased efficiency.

According to a further implementation form of the first aspect, the at least one object comprises or is at least one sensing unit and/or at least one sensor, and in an example, at least one sensing unit and/or at least one sensor and/or at least one multi-electrode array in the context of neural recording, such as intracortical neural recording. In addition to this or as an alternative, the at least one object comprises or is at least one radar and/or at least one camera, and in an example, at least one event-driven radar and/or at least one neuromorphic camera, and in another example, at least one event-driven radar and/or at least one neuromorphic camera in the context of smart building applications, and in another example, at least one event-driven radar and/or at least one neuromorphic camera in the context of occupancy sensing such as with respect to smart building applications. In an example, this facilitates ensuring a particularly high flexibility, thereby further increasing efficiency.

According to a further implementation form of the first aspect, the at least one event comprises or is associated with a change in the context of at least one measurement, and in an example, a change with respect to the at least one object and/or the environment of the at least one object. In an example, this facilitates further increased efficiency.

According to a second aspect, an event-driven transmission device is provided. The device comprises a transmitting unit configured to convert at least one event to at least one corresponding pulse pair and to transmit the at least one pulse pair. In this context, a delay between each pulse pair represents a corresponding identifier with respect to the respective event or with respect to at least one corresponding object causing or experiencing the respective event. In an example, this facilitates significantly reducing an overhead and a collision risk, which leads to a particularly efficient transmission or communication, respectively. Further, the at least one event may comprise information of polarity, and in an example, positive and/or negative polarity. It is noted that the at least one event may comprise or be a bipolar event.

According to a first implementation form of the second aspect, the at least one pulse pair comprises or is at least one differential pulse. In an example, this facilitates reducing complexity, thereby increasing efficiency.

According to a second implementation form of the second aspect, for transmitting the at least one pulse pair, the transmitting unit is configured to encode the at least one pulse pair according to a Manchester code, and in an example, a bipolar Manchester code. In an example, this facilitates suppressing, low-frequency content of the respective signal, which further increases immunity to the respective communication channel.

According to a further implementation form of the second aspect, for transmitting the at least one pulse pair, the transmitting unit is configured to encode the at least one pulse pair according to a phase modulation, e.g., a differential phase modulation. In an example, this facilitates demodulating by the respective receiver the corresponding signal without recovering the respective carrier frequency and phase.

According to a further implementation form of the second aspect, the phase modulation comprises rotating between at least two predefined phases, and in an example, between at least three predefined phases with at least one predefined phase difference with regard to each other, and in another example, between three predefined phases with a phase difference of 120 degrees with regard to each other, and in another example, between phases of 0 degrees, 120 degrees, and 240 degrees. In an example, this facilitates ensuring a higher immunity toward a carrier offset on the respective receiver side.

According to a further implementation form of the second aspect, transmitting the at least one pulse pair is based on an impulse-radio ultra-wideband communication, and in an example, an asynchronous impulse-radio ultra-wideband communication. In an example, this facilitates further reducing complexity, which leads to increased efficiency.

According to a further implementation form of the second aspect, the at least one object comprises or is at least one sensing unit and/or at least one sensor, and in an example, at least one sensing unit and/or at least one sensor and/or at least one multi-electrode array in the context of neural recording, such as intracortical neural recording. In addition to this or as an alternative, the at least one object comprises or is at least one radar and/or at least one camera, and in an example, at least one event-driven radar and/or at least one neuromorphic camera, and in another example, at least one event-driven radar and/or at least one neuromorphic camera in the context of smart building applications, and in another example, at least one event-driven radar and/or at least one neuromorphic camera in the context of occupancy sensing, e.g., with respect to smart building applications. In an example, this facilitates ensuring a particularly high flexibility, thereby further increasing efficiency.

According to a further implementation form of the second aspect, the at least one event comprises or is a change especially in the context of at least one measurement, and in another example, a change with respect to the at least one object and/or the environment of the at least one object. In an example, this facilitates further increasing efficiency.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
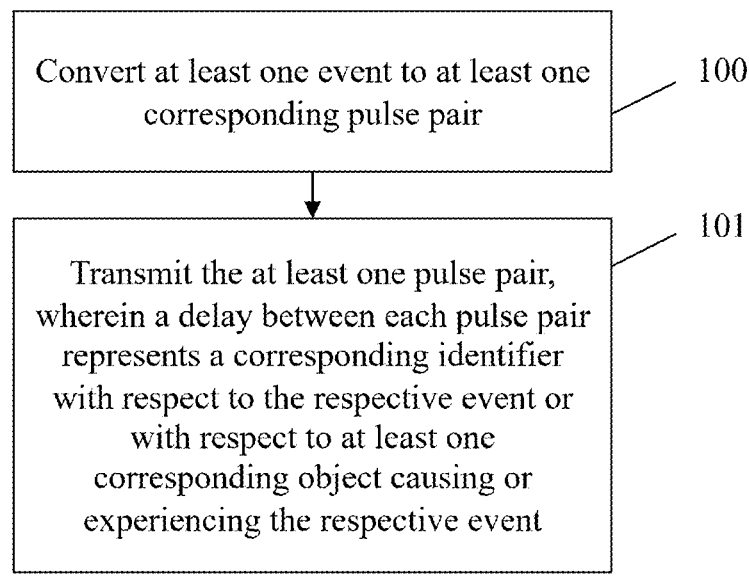
FIG. 1 shows a flow chart of the event-driven transmission method, in accordance with an example embodiment.

FIG. 1 shows a flow chart of an example embodiment of an event-driven transmission method. In a first step 100, at least one event is converted to at least one corresponding pulse pair. Then, in a second step 101, the at least one pulse pair is transmitted. In this context, a delay between each pulse pair represents a corresponding identifier with respect to the respective event or with respect to at least one corresponding object causing or experiencing the respective event.

In some examples, the at least one pulse pair comprises or is at least one differential pulse. Furthermore, for transmitting the at least one pulse pair, the at least one pulse pair may be encoded according to a Manchester code, and in an example, a bipolar Manchester code. In an example, the encoding may be used in the case of a wired transmission or communication.

Moreover, for transmitting the at least one pulse pair, the at least one pulse pair may be encoded according to a phase modulation, and in an example, a differential phase modulation. In an example, the encoding may be used in the case of a wireless transmission or communication.

In this context, the phase modulation may comprise rotating between at least three predefined phases, in an example, between at least three predefined phases with at least one predefined phase difference with regard to each other, in another example, between three predefined phases with a phase difference of 120 degrees with regard to each other, and in another example, between phases of 0 degrees, 120 degrees, and 240 degrees. In an example, transmitting the at least one pulse pair is based on an impulse-radio ultra-wideband (IR-UWB) communication, e.g., an asynchronous impulse-radio ultra-wideband communication.

Figure 6:
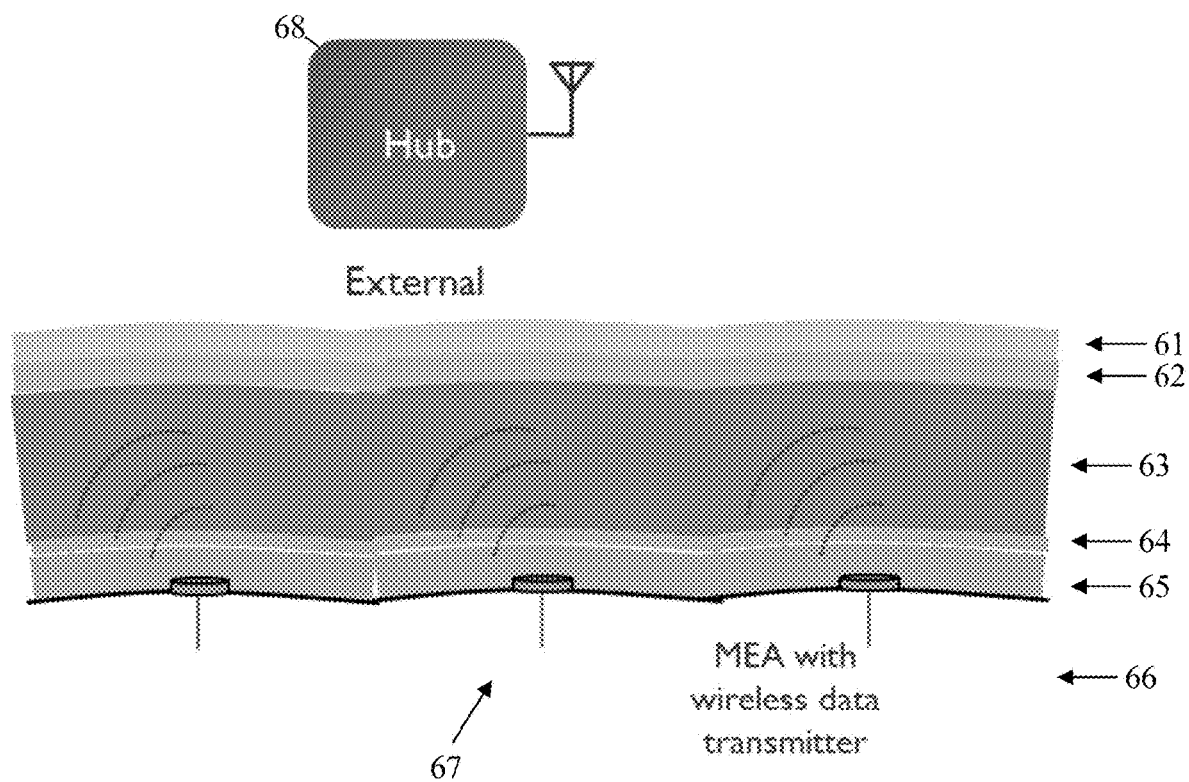
FIG. 6 shows a usage scenario with respect to an aspect, in accordance with an example embodiment

With respect to the at least one object, it is noted that the at least one object may comprise or be at least one sensing unit and/or at least one sensor, and in an example, at least one sensing unit and/or at least one sensor and/or at least one multi-electrode array in the context of neural recording, such as intracortical neural recording, which is illustrated by FIG. 6.

Figure 7:
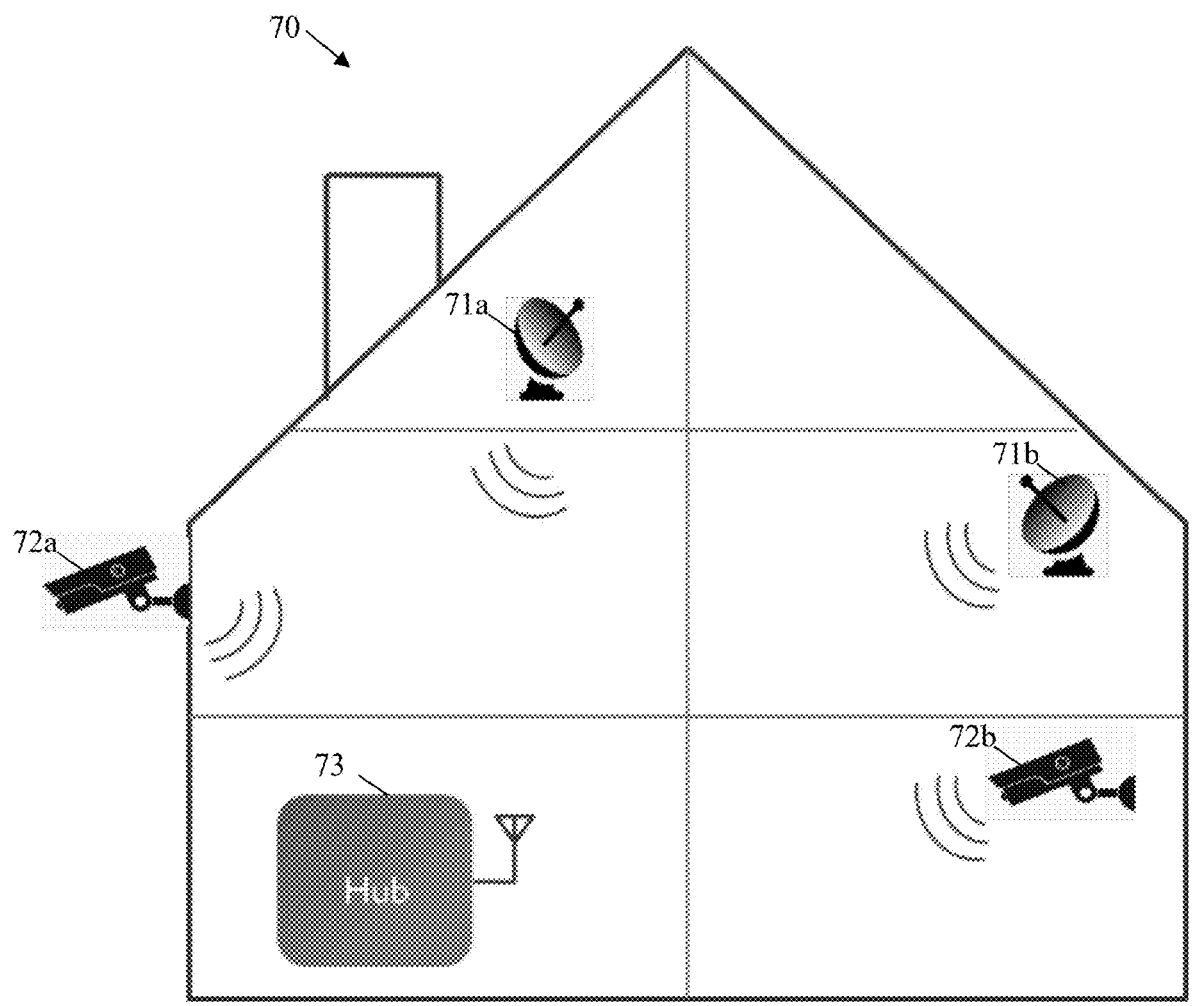
FIG. 7 shows a further usage scenario with respect to the aspect, in accordance with an example embodiment.

In addition to this or as an alternative, the at least one object may comprise or be at least one radar and/or at least one camera, and in an example, at least one event-driven radar and/or at least one neuromorphic camera, in another example, at least one event-driven radar and/or at least one neuromorphic camera in the context of smart building applications, and in another example, at least one event-driven radar and/or at least one neuromorphic camera in the context of occupancy sensing with respect to smart building applications, which is illustrated by FIG. 7.

With respect to the at least one event, it is noted that the at least one event may comprise or be a change in the context of at least one measurement, and in another example, a change with respect to the at least one object and/or the environment of the at least one object.

Figure 2:
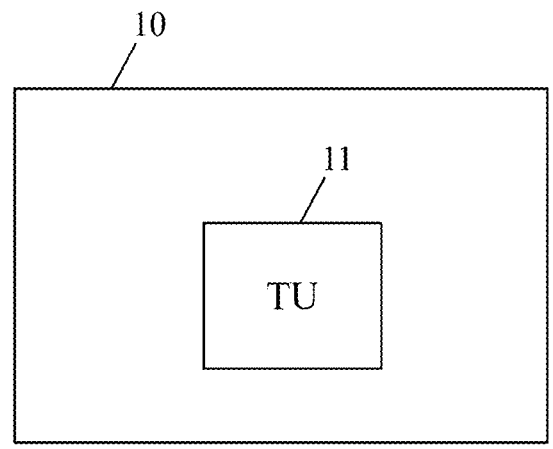
FIG. 2 shows the event-driven transmission device, in accordance with an example embodiment.

Now, with respect to FIG. 2, an embodiment of the event-driven transmission device 10 is illustrated. The device 10 comprises a transmitting unit 11 configured to convert at least one event to at least one corresponding pulse pair and to transmit the at least one pulse pair. In this context, a delay between each pulse pair represents a corresponding identifier with respect to the respective event or with respect to at least one corresponding object causing or experiencing the respective event. In an example, the at least one pulse pair comprises or is at least one differential pulse.

It is further noted that for transmitting the at least one pulse pair, the transmitting unit 11 may be configured to encode the at least one pulse pair according to a Manchester code, and in an example, a bipolar Manchester code. This encoding may be applied in the case of a wired transmission or communication, respectively.

Furthermore, for transmitting the at least one pulse pair, the transmitting unit 11 may be configured to encode the at least one pulse pair according to a phase modulation, and in an example, a differential phase modulation. This encoding may be applied in the case of a wireless transmission or communication, respectively.

In this context, the phase modulation may comprise rotating between at least three predefined phases, and in an example, between at least three predefined phases with at least one predefined phase difference with regard to each other, and in another example, between three predefined phases with a phase difference of 120 degrees with regard to each other, and in another example, between phases of 0 degrees, 120 degrees, and 240 degrees. Moreover, transmitting the at least one pulse pair may be based on an impulse-radio ultra-wideband (IR-UWB) communication, and in an example, an asynchronous impulse-radio ultra-wideband communication.

With respect to the at least one object, it is noted that the at least one object may comprise or be at least one sensing unit and/or at least one sensor, and in an example, at least one sensing unit and/or at least one sensor and/or at least one multi-electrode array in the context of neural recording, such as intracortical neural recording, which is illustrated by FIG. 6 as already noted above.

Additionally or alternatively, the at least one object may comprise or be at least one radar and/or at least one camera, and in an example, at least one event-driven radar and/or at least one neuromorphic camera, and in another example, at least one event-driven radar and/or at least one neuromorphic camera in the context of smart building applications, and in another example, at least one event-driven radar and/or at least one neuromorphic camera in the context of occupancy sensing especially with respect to smart building applications, which is illustrated by FIG. 7 as already noted above.

With respect to the at least one event, it is noted that the at least one event may comprise or be a change in the context of at least one measurement, and in an example, a change with respect to the at least one object and/or the environment of the at least one object.

Figure 3A:
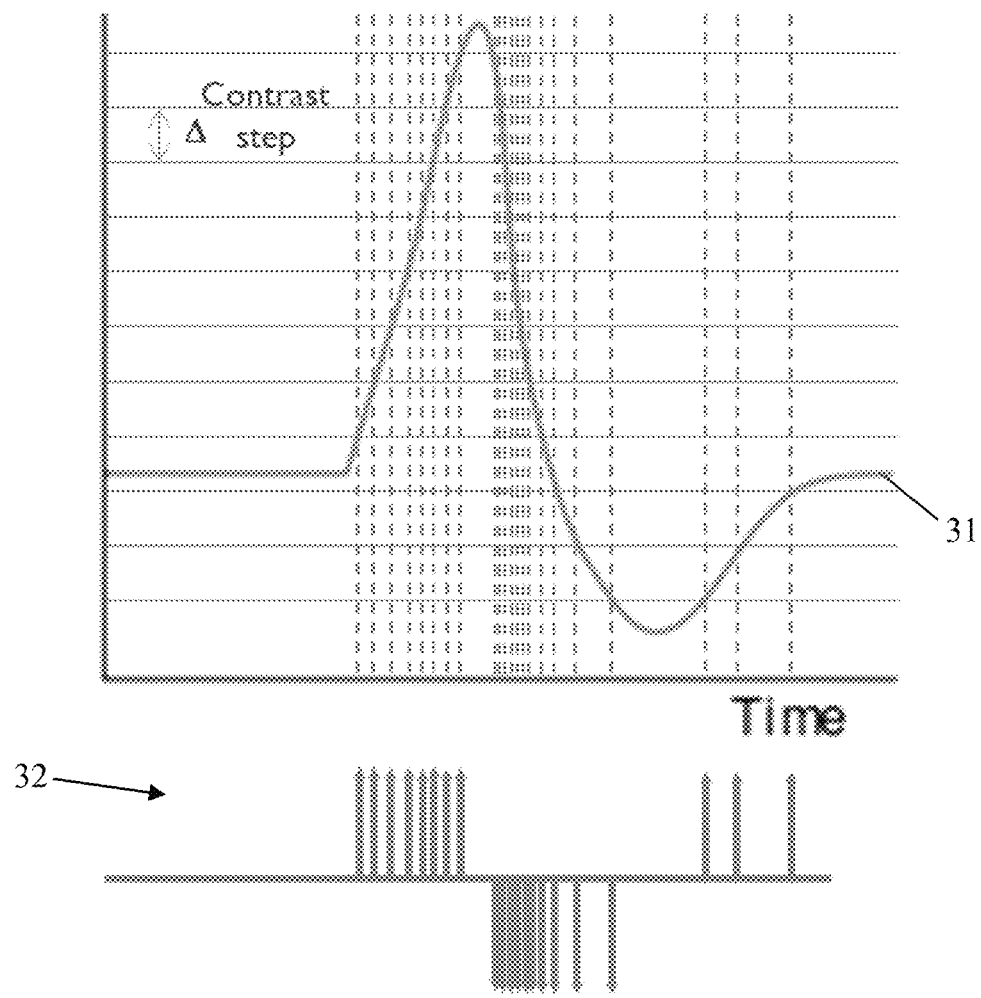
FIG. 3A shows a sensor signal being digitized in the context of event encoding, in accordance with an example embodiment.

Now, with respect to FIG. 3A, an example sensor signal 31 in the context of event encoding 32 is shown. The event encoding 32 can be implemented with an event-based analog-to-digital converter (ADC), for instance, a level-crossing ADC, which produces a positive event when crossing one contrast step or quantization step, respectively, with rising slope, and a negative event with falling slope (or vice versa).

It is noted that the respective ADC output may especially comprise a 2-bit ternary format (i.e., +1, 0, and −1), which may be comprised by an event, and in an example, by a bipolar event. This event-based sampling approach only samples the signal when there are activities from the corresponding sensor output. This facilitates significantly reducing the computation task for respective following stages, while preserving important waveform features in the density and polarity of the events. Further, when the sensing signals need to be streamed out, the transmission energy of such an event-based transmission is also significantly reduced.

Yet further, such an event-based transmission can be applied to a sensor network with multiple sensor units. In this network, transmitting asynchronous events from multiple sensors may require serialization in the case of a wireline or wired communication (see FIG. 3B) or time-multiplexing in the medium in the case of a wireless communication (see FIG. 3C).

Figure 3B:
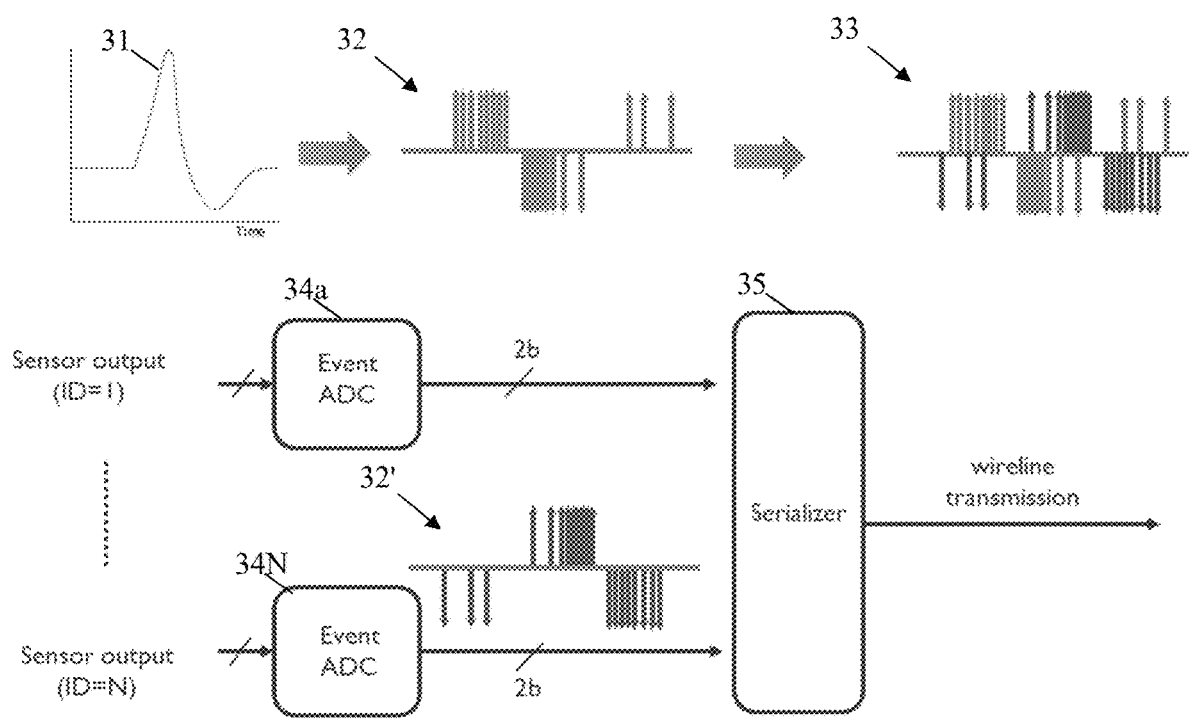
FIG. 3B shows an asynchronous events transmission from multiple sensors in the context of a wired communication, in accordance with an example embodiment.

In accordance with FIG. 3B, there may be at least two sensors or at least two sensor outputs, respectively. In an example, there are N sensors or N sensor outputs, respectively. Each of the N sensors may be connected to a corresponding event-based ADC 34a, . . . , 34N. In addition to this, the N event-based ADCs 34a, . . . , 34N are connected to a serializer 35.

As it can further be seen from FIG. 3B, an example of the first sensor output comprises the sensor signal 31 being provided for the first event-based ADC 34a. In an example, the first event-based ADC 34a converts the sensor signal 31 to the event encoded signal 32. By analogy therewith, in an example, the N-th event-based ADC 34N converts the corresponding sensor signal of the N-th sensor output to a further event encoded signal 32'.

Figure 3C:
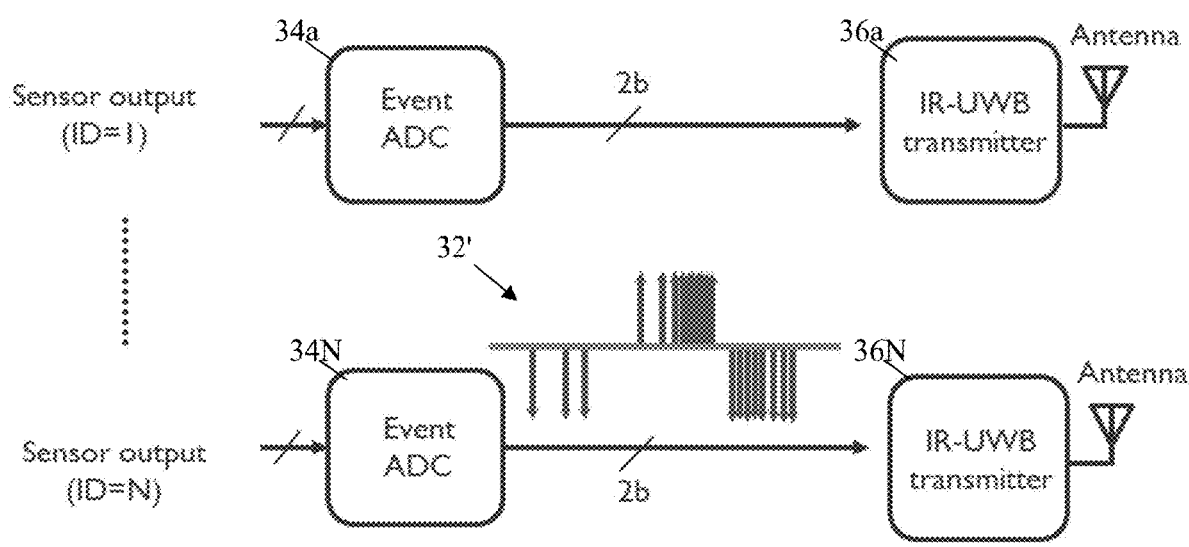
FIG. 3C shows an asynchronous events transmission from multiple sensors in the context of a wireless communication, in accordance with an example embodiment.

Furthermore, in an example, the serializer 35 forms a serialized event encoded signal 33 on the basis of the event encoded signal 32 and the further event encoded signal 32' for the subsequent wired communication or transmission, respectively. In contrast to FIG. 3B, in the case of a wireless communication or transmission, respectively, the serializer 35 may be replaced by N wireless transmitters, and in an example, N IR-UWB transmitters 36a, . . . , 36N as illustrated by FIG. 3C.

Figure 4:
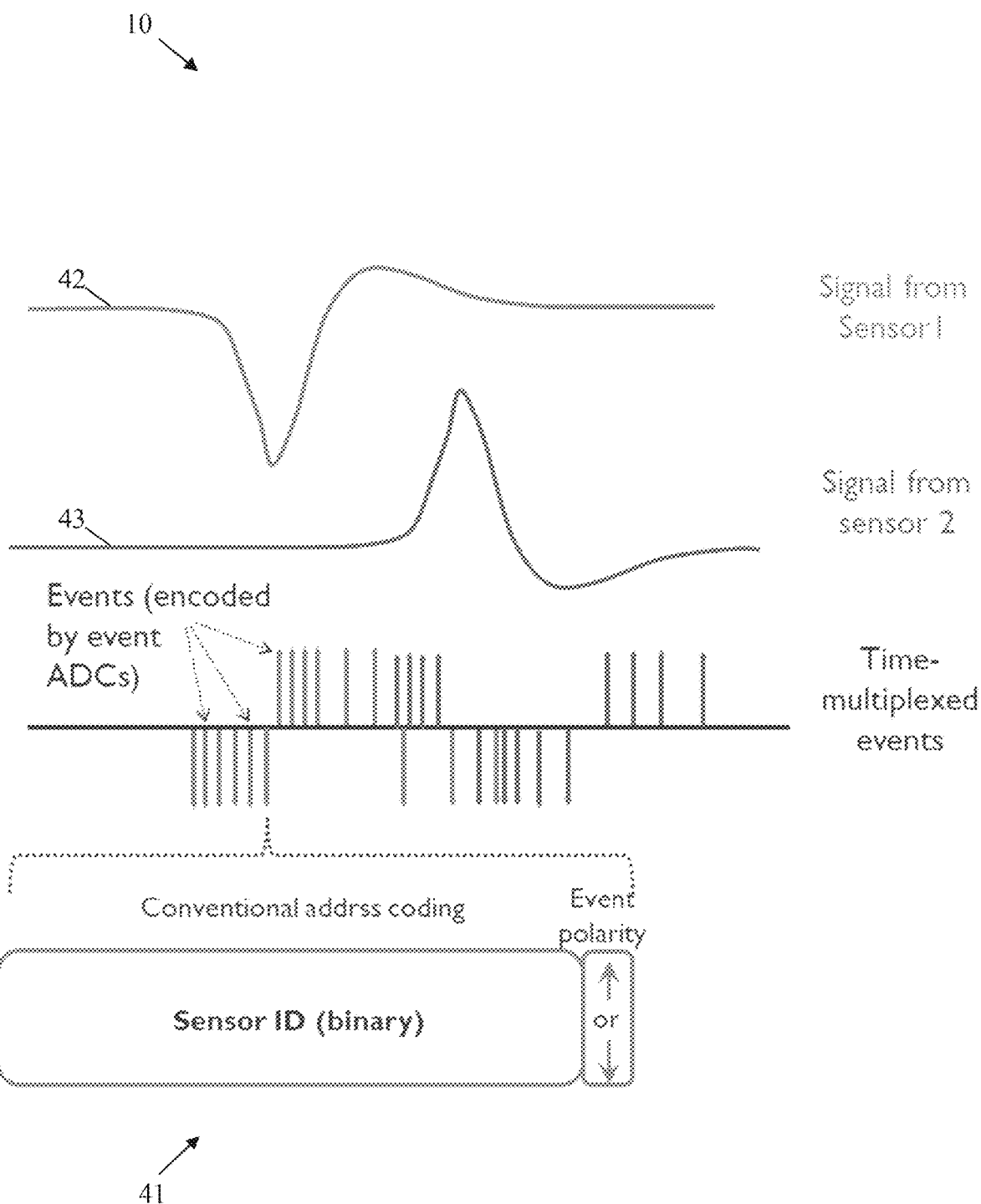
FIG. 4 shows an events transmission from two sensors with respect to a conventional address-event representation, in accordance with an example embodiment.

Moreover, FIG. 4 depicts an example embodiment of an events transmission from two sensors in the context of a conventional address-event representation (AER) or a conventional address-event representation format 41, respectively. In this context, transmitting asynchronous events from multiple sensor units, e.g., two sensor units illustrated by the two sensor signals 42, 43, can present certain challenges. For example, such systems have limited capacity to upscale the number of sensor units due to the high collision risk and protocol overhead.

Furthermore, streaming asynchronous events from multiple sensors requires the inclusion of a corresponding original sensor identifier (ID), such that the receiver has the information about where (or which sensor) these events come from. The binary ID of the sensors (i.e., the address) will be attached along with each event, as shown by the AER format 41. An extra event polarity bit also needs to be included for the ternary data to indicate it is +1 or −1.

It is to be pointed out that this conventional approach according to FIG. 4 has several problems, which are addressed below. It is further to be pointed out that one or more of these problems can be addressed with the aid of the aspects disclosed herein.

Disadvantageously, in accordance with the conventional AER, there is high energy overhead and an increased collision risk. In this context, the conventional AER introduces a large overhead in active time, which makes the transmission inefficient because the sensor IDs need to be transmitted every time with the data. It is also not reliable because longer active time leads to a higher chance of collision. For instance, 128 channels need a 7-bit address on top of a 1-bit event polarity, so this already introduces 87% of transmission energy overhead and an eight times higher probability of collision.

Further disadvantageously, according to the conventional AER, there is a low-frequency signal leakage. When the serialized signal is directly transmitted, as shown in FIG. 3B, a low-frequency content will also be produced along the communication channel.

This will introduce interference between different units. Furthermore, in an example use case, if the communication channel is leaked to the human body in an in-body communication scenario, it will violate the safety regulation. In this context, for instance, IEC-60601 specifies that the low-frequency electrical leakage current should be lower than an acceptable and safe level, as low as 10 microamperes below one kilohertz.

As a further disadvantage, according to the conventional AER or a conventional modulation, respectively, there is a wireless modulation overhead. In this context, IR-UWB (especially without modification and/or not used in the context of the disclosed aspects) may be applied as the wireless communication approach for such an event-based system to preserve its time information. Furthermore, a pulse-position modulation (PPM) may be used for IR-UWB because of its energy-efficient implementation. However, a PPM symbol requires about four times longer period (especially including guard intervals).

Although a binary phase shift keying (BPSK) impulse modulation can time-efficiently deliver information in one pulse period, it will not be feasible in the targeted event-based wireless sensor network. This is because that one IR-UWB receiver will receive signals from multiple transmitters sending signals simultaneously and asynchronously. It will be difficult for the receiver to recover carrier frequencies if two events are too close in time.

Figure 5A:
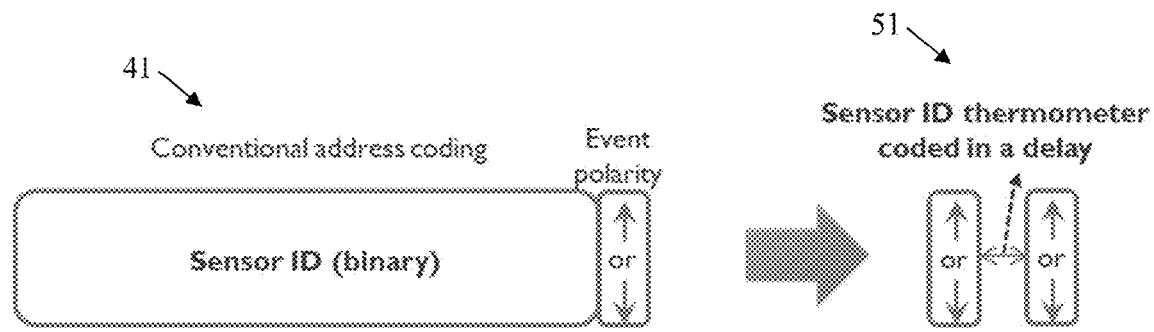
FIG. 5A shows a time-delay address-event representation, in accordance with an example embodiment.

To minimize the overhead and collision risk, the active time of each event should be minimized. In contrast to the above-mentioned conventional AER format 41, an example embodiment of an AER format or a time-delay address-event representation (TD-AER) format 51, respectively, especially in a differential pulse format, is illustrated by FIG. 5A. In this context, a sensor ID, e.g., the ID of a temperature sensor or a thermometer, is coded as a delay between two differential pulses.

More specifically, each event is converted to a pulse pair (preferably one start and one stop pulse), or a differential pulse. Then the ID of the sensor is represented by a delay between this differential pulse. For instance, sensor 1 (ID=1) may have a delay between two pulses of 1*Tunit, while sensor 4 (ID=4) may have a delay of 4*Tunit. Generally, the N-th sensor or sensing unit may comprise a delay of N*Tunit.

Figure 5B:
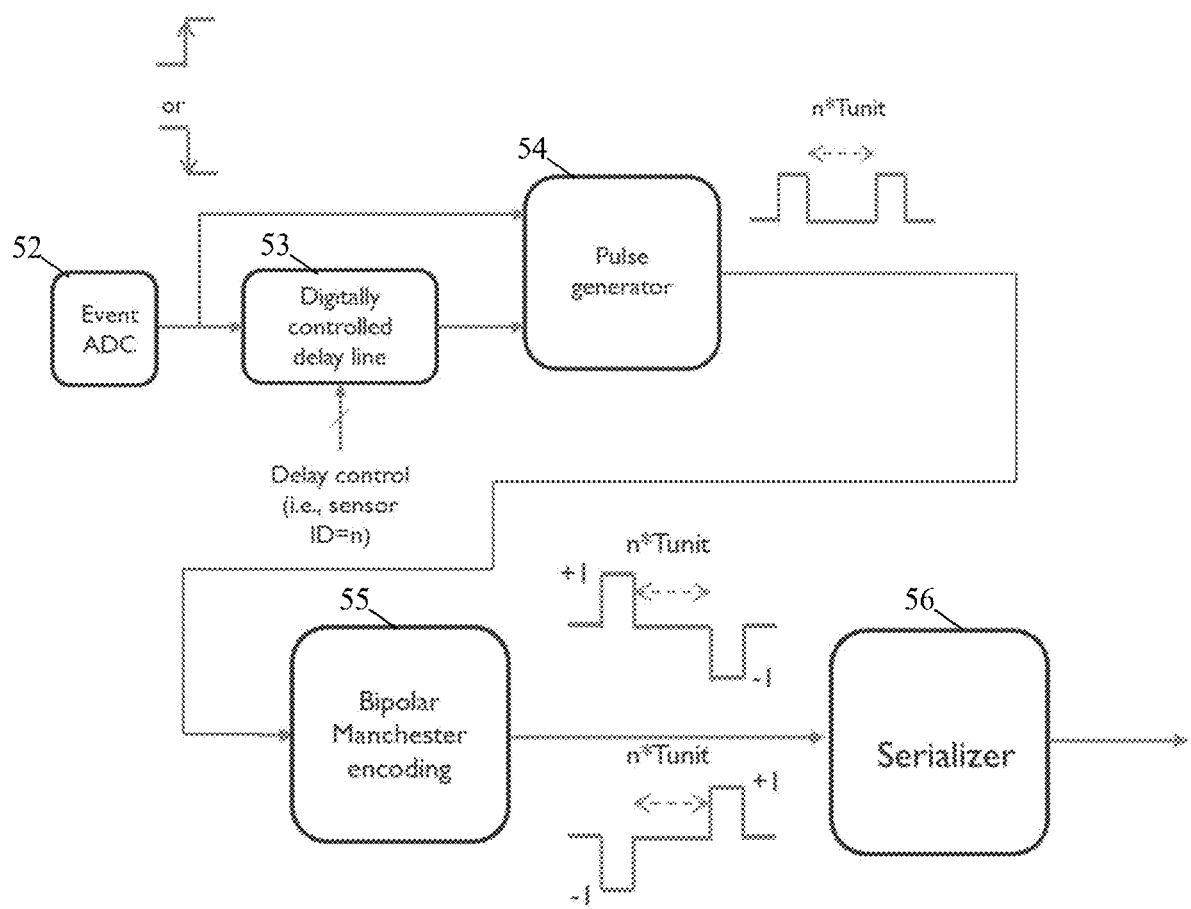
FIG. 5B shows a transmission device in the context of a wired communication, in accordance with an example embodiment.

FIG. 5B shows one example of how the differential pulses can be produced using a digitally controlled delay line 53 and a pulse generator 54. Due in part to the high switching speed of modern nanoscale complementary metal-oxide-semiconductor (CMOS) transistors, the time resolution of the digitally controlled delay line 53 can achieve down to picosecond range. Hence, IDs of up to hundreds of sensor units can be coded in just a few nanoseconds.

In particular, FIG. 5B illustrates an example embodiment of the event-driven transmission device in the context of a wired transmission or communication, respectively. In this context, an output of an event-based ADC 52 is connected to an input of the digitally controlled delay line 53 and an input of the pulse generator 54, whereas an output of the delay line 53 is connected to a further input of the pulse generator 54. Furthermore, an output of the pulse generator 54 is connected to an input of a serializer 56, and in an example, via a bipolar Manchester encoding unit 55.

It is noted that the respective differential pulse format also helps to suppress low-frequency content. In an example, Manchester encoding helps to minimize the low-frequency content, which facilitates an increase in the galvanic isolation between the transmitter and the receiver. In such encoding, data 1 is converted to 01, and data 0 is converted to 10 (or vice versa). This Manchester encoding can be easily employed in the inventive differential pulse format.

With special respect to FIG. 5B, in an example, bipolar Manchester encoding is applied to suppress low-frequency content of the signal, wherein the positive event {+1} is encoded as {+1, 0, −1}, while the negative event is encoded as {−1, 0, +1} or vice versa.

Figure 5C:
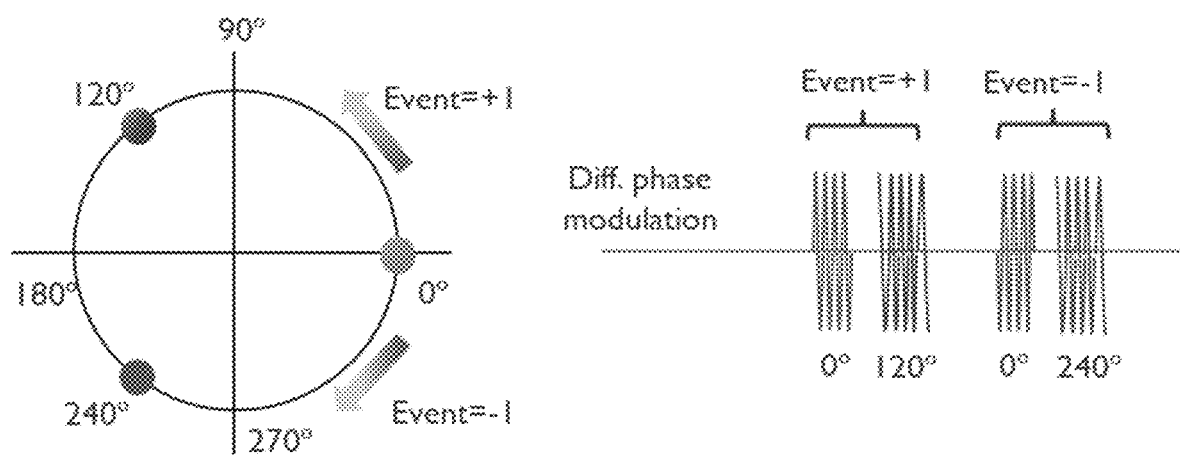
FIG. 5C shows a differential phase modulation, in accordance with an example embodiment.

When applying this signal format in wireless transmission using IR-UWB, the disclosed differential pulse format can further utilize a differential phase modulation, as illustrated by FIG. 5C. In this context, the event polarity especially is in the direction of phase rotation, instead of the absolute phase, so the receiver can demodulate the signal without recovering the carrier frequency. In accordance with FIG. 5C, an example of a differential three-phase modulation is shown, i.e., rotating between 0°, 120°, and 240° phases.

Figure 5D:
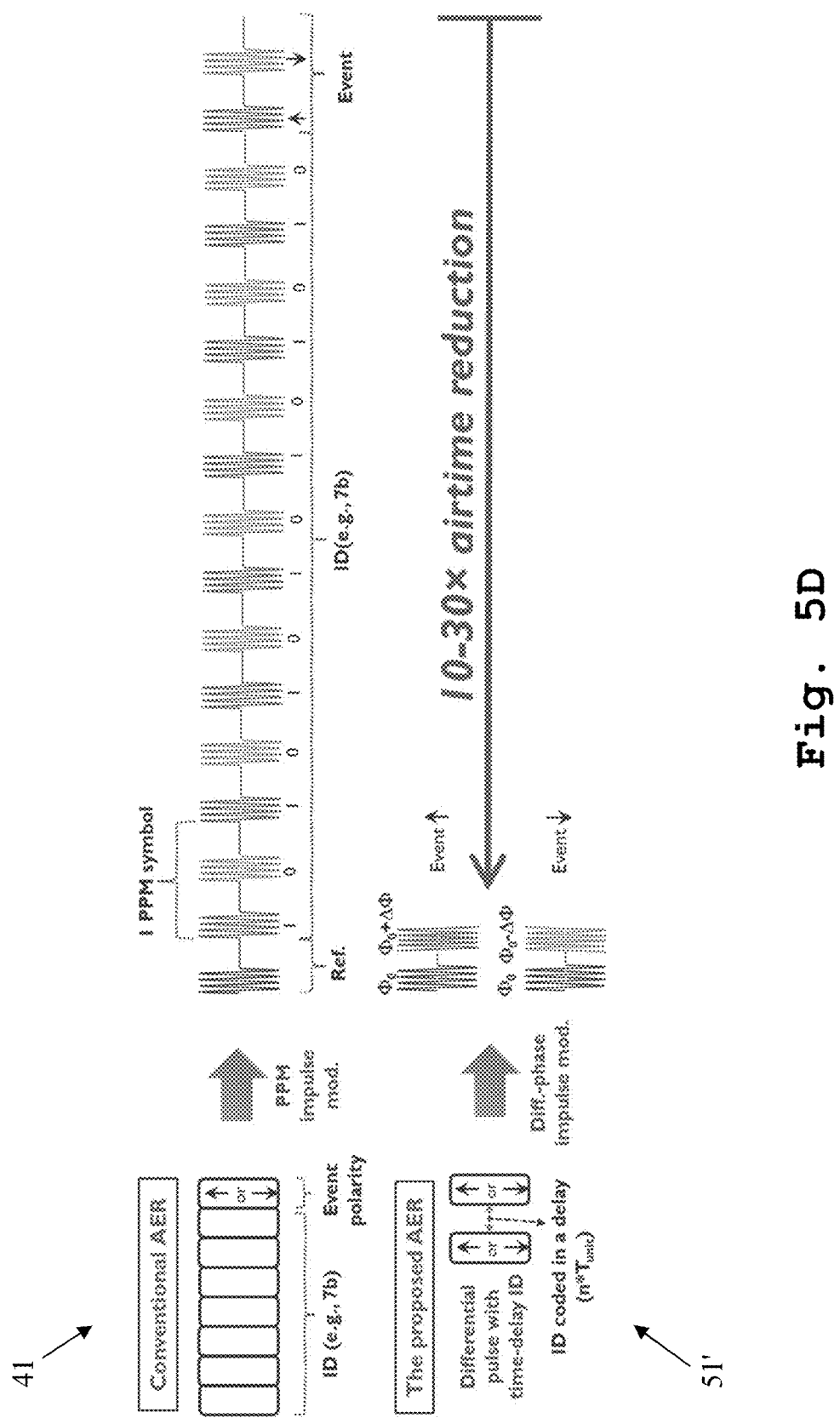
FIG. 5D shows a comparison between a conventional address-event representation and the address-event representation, in accordance with an example embodiment.

In an example, this requires only three phases from the transmitter side in accordance with FIG. 5D showing an example of a comparison between the conventional address-event representation 41 and an embodiment of the address-event representation 51', while having a higher immunity toward carrier offset on the receiver side. When combining the disclosed time-delay address-event format and the differential phase modulation, the active time of the event can be reduced by 10 to 30 times, as exemplarily illustrated by FIG. 5D.

Figure 5E:
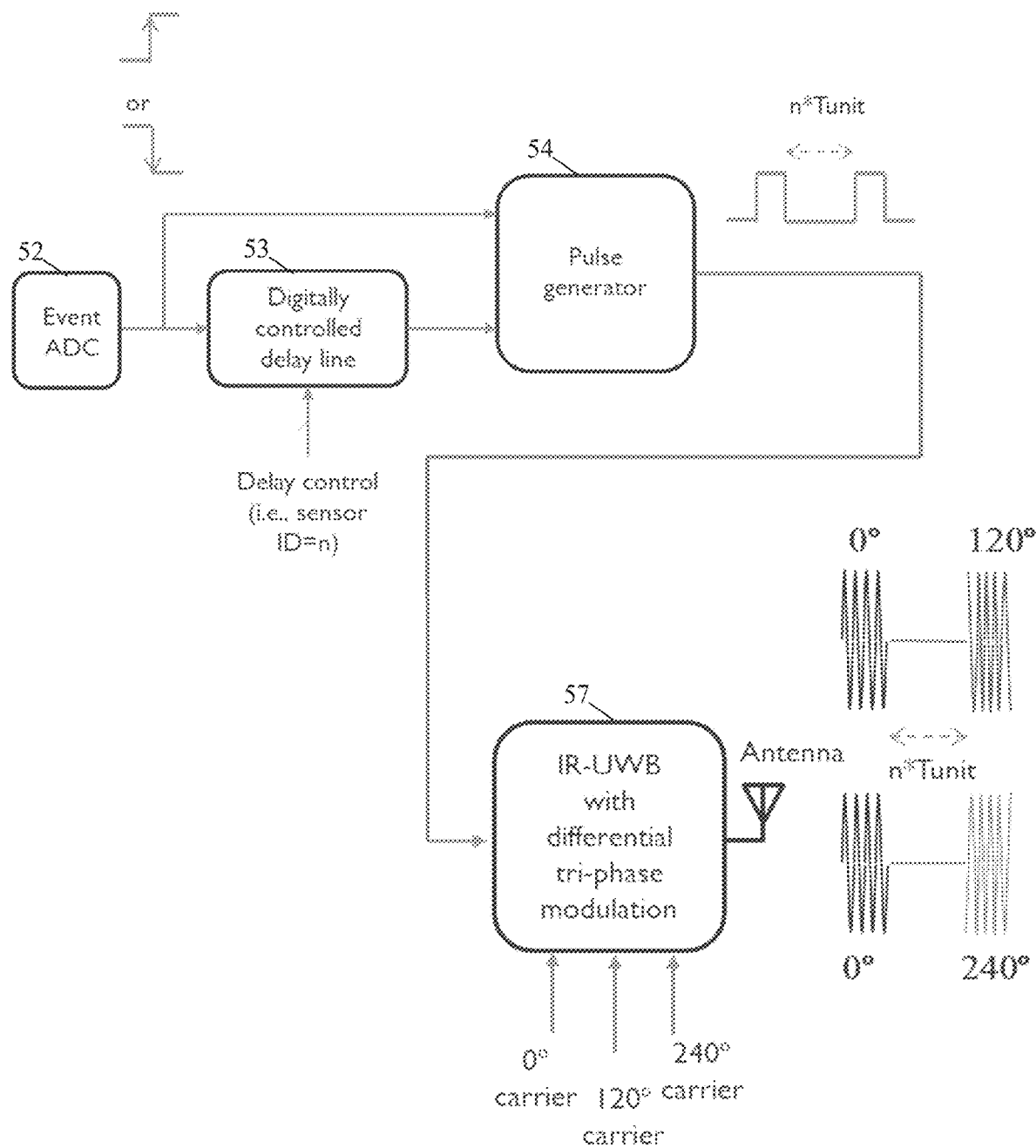
FIG. 5E shows a transmission device in the context of a wireless communication, in accordance with an example embodiment.

Furthermore, in accordance with FIGS. 5B and 5E, two examples of implementing the disclosed event-based transmission in multi-sensor scenarios, and in an example, with a differential pulse format, are shown. In contrast to FIG. 5B, having already been described above in the context of a wired transmission or communication, respectively, FIG. 5E shows an example embodiment in the context of a wireless transmission or communication, respectively. According to FIG. 5E, the bipolar Manchester encoding unit 55 and the serializer 56 of FIG. 5B have, in an example, been replaced by a unit 57 for applying IR-UWB with the above-mentioned differential tri-phase modulation.

Again, with respect to the conventional AER and the inventive AER, it is to be pointed out that the disclosed event-based transmission especially using differential pulse format facilitates the realization of the following aspects:

The respective transmission energy overhead for adding sensor IDs can be minimized.

By leveraging the respective fine time resolution, the respective active time of events is reduced, which minimizes the risk of collisions.

The disclosed differential pulse format is more compatible with bipolar Manchester coding, which minimizes the low-frequency signal content. This is especially critical to minimize the interference between channels as well as the leakage in certain applications.

The disclosed differential pulse format is easier to adopt differential phase modulation, which relaxes the respective carrier frequency synchronization.

Furthermore, it is generally noted that the aspects disclosed herein may be used in the context of a transmission, such as an event-based pulse transmission, from multiple users and/or sensing units. Additionally or alternatively, the aspects disclosed herein may be used to support simultaneously transmitting by a large number of sensing units.

As already noted above, FIG. 6 depicts an example of a usage scenario with respect to a disclosed aspect. More specifically, the disclosed aspects are used in the context of intracortical neural recording with high-density multi-electrode arrays (MEA) 67. For instance, silicon-based MEAs may comprise up to 394 recording channels. They are used to record the action potential of neurons. In each recording channel, the action potential signals will be digitized by an ADC, e.g., sampled by a clock with a fixed frequency, yielding a large amount of data. This situation is even worse when distributed neural recording with MEA implanted at multiple regions of the cortex 66.

When the number of channels of each MEA or the number of distributed MEAs increases, the disclosed AER ensures a particularly high efficiency with respect to the transmission to the exemplary hub 68. The disclosed AER, and in an example based on time-delay, can drastically reduce the airtime, e.g., by leveraging the fast transistor switching in the modern nanoscale CMOS technologies. For the sake of completeness, it is noted that FIG. 6 further shows the scalp 61, fat 62, skull 63, dura 64, and cerebrospinal fluid 65.

Finally, with respect to FIG. 7, as already noted above, a further example usage scenario is illustrated. In this context, the disclosed aspects facilitate the collection of the data from multiple event-driven radars 71a, 71b or neuromorphic cameras 72a, 72b for occupancy sensing in smart building applications.

For instance, a battery-powered radar may achieve an extremely low power consumption, which extends battery life up to years. Since it consumes very low power, it can be used to continuously monitor the occupancy of the space. If any human activities are detected by this radar, such as the radars 71a, 71b, it will then activate other devices to perform other functions that require higher processing power. Similar to the neuromorphic cameras such as the cameras 72a, 72b, the event encoding as described above can be adopted to minimize the computation power consumption in these radars.

These event-driven radars 71a, 71b and neuromorphic cameras 72a, 72b are distributed at different locations of a building 70, especially a smart building. Furthermore, these event-driven radars 71a, 71b and neuromorphic cameras 72a, 72b send the respective encoded asynchronous events to a central hub 73, e.g., wirelessly, for further processing.

It is further noted that conventional wireless communication protocols such as WiFi are not suitable because of inefficient hardware for converting data between asynchronous and synchronous formats. In this regard, disclosed aspects serve as a wireless communication protocol.

While various embodiments have been described above, it should be understood that they have been presented by way of example only and not as limitations. Numerous changes to the disclosed embodiments can be made in accordance with the disclosure herein without departing from the spirit or scope of the claims. Thus, the breadth and scope of the claims should not be limited by any of the above-described embodiments.

Although the invention has been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired for any given or particular application.

What is claimed is:

1. An event-driven transmission method comprising:
   converting at least one event to at least one corresponding pulse pair, wherein the at least one corresponding pulse pair comprises a start pulse and a stop pulse; and
   transmitting the at least one corresponding pulse pair, wherein transmitting the at least one corresponding pulse pair comprises encoding the at least one pulse pair according to a differential phase modulation,
   wherein a delay between the start pulse and the stop pulse represents a corresponding identifier with respect to the respective event or with respect to at least one corresponding object causing or experiencing the respective event, wherein the at least one object comprises or corresponds to at least one of a sensing unit or a multi-electrode array.

2. The event-driven transmission method according to claim 1,
wherein the at least one corresponding pulse pair comprises or is at least one differential pulse.

3. The event-driven transmission method according to claim 1,
wherein transmitting the at least one corresponding pulse pair comprises encoding the at least one pulse pair according to a bipolar Manchester code.

4. The event-driven transmission method according to claim 1,
wherein the differential phase modulation comprises rotating between: at least two predefined phases; at least three predefined phases with at least one predefined phase difference with regard to each other; three predefined phases with a phase difference of 120 degrees with regard to each other; or phases of 0 degrees, 120 degrees, and 240 degrees.

5. The event-driven transmission method according to claim 1,
wherein transmitting the at least one corresponding pulse pair is based on an asynchronous impulse-radio ultra-wideband communication.

6. The event-driven transmission method according to claim 1,
wherein the multi-electrode array facilitates intracortical neural recording.

7. The event-driven transmission method according to claim 1,
wherein the at least one object comprises or corresponds to at least one radar that facilitates sensing an occupancy of a building.

8. The event-driven transmission method according to claim 1,
wherein the at least one object comprises or corresponds to at least one neuromorphic camera that facilitates sensing an occupancy of a building.

9. The event-driven transmission method according to claim 1,
wherein the at least one event is associated with a change in at least one measurement.

10. The event-driven transmission method according to claim 9,
wherein the change in the at least one measurement is associated with a change in an environment associated with the at least one object.

11. An event-driven transmission device comprising:
a transmitting unit configured to convert at least one event to at least one corresponding pulse pair and to transmit the at least one corresponding pulse pair, wherein the at least one corresponding pulse pair comprises a start pulse and a stop pulse, and wherein the transmitting unit is configured to encode the at least one corresponding pulse pair according to a differential phase modulation to facilitate transmitting the at least one corresponding pulse pair,
wherein a delay between the start pulse and the stop pulse represents a corresponding identifier with respect to the respective event or with respect to at least one corresponding object causing or experiencing the respective event, wherein the at least one object comprises or corresponds to at least one of a sensing unit or a multi-electrode array.

12. The event-driven transmission device according to claim 11,
wherein the at least one corresponding pulse pair comprises or is at least one differential pulse.

13. The event-driven transmission device according to claim 11,
wherein the transmitting unit is configured to encode the at least one corresponding pulse pair according to a bipolar Manchester code to facilitate transmitting the at least one corresponding pulse pair.

14. The event-driven transmission device according to claim 11,
wherein the differential phase modulation comprises rotating between: at least two predefined phases; at least three predefined phases with at least one predefined phase difference with regard to each other; three predefined phases with a phase difference of 120 degrees with regard to each other; or phases of 0 degrees, 120 degrees, and 240 degrees.

15. The event-driven transmission device according to claim 14,
wherein transmitting the at least one corresponding pulse pair is based on an asynchronous impulse-radio ultra-wideband communication.

16. The event-driven transmission device according to claim 11,
wherein the multi-electrode array facilitates intracortical neural recording.

17. The event-driven transmission device according to claim 11,
wherein the at least one object comprises or corresponds to at least one event-driven radar or at least one neuromorphic camera that facilitates sensing an occupancy of a building.

* * * * *